United States Patent
Naito

(10) Patent No.: US 9,081,921 B2
(45) Date of Patent: Jul. 14, 2015

(54) METHOD FOR SIMULATING RUBBER COMPOUND

(75) Inventor: Masato Naito, Kobe (JP)

(73) Assignee: SUMITOMO RUBBER INDUSTRIES, LTD., Kobe-Shi (JP)

( * ) Notice: Subject to any disclaimer, the term of this patent is extended or adjusted under 35 U.S.C. 154(b) by 562 days.

(21) Appl. No.: 13/445,957

(22) Filed: Apr. 13, 2012

(65) Prior Publication Data

US 2012/0323540 A1 Dec. 20, 2012

(30) Foreign Application Priority Data

Jun. 16, 2011 (JP) .................. 2011-134443

(51) Int. Cl.
*G06F 17/50* (2006.01)
*B60C 99/00* (2006.01)

(52) U.S. Cl.
CPC .......... *G06F 17/5018* (2013.01); *B60C 99/006* (2013.04)

(58) Field of Classification Search
CPC ............ G06F 17/5018; G06F 17/5095; G06F 2217/16; B60C 99/006
See application file for complete search history.

(56) References Cited

U.S. PATENT DOCUMENTS

2006/0136151 A1* 6/2006 Shiraishi .................. 702/42

FOREIGN PATENT DOCUMENTS

| EP | 1526468 A2 | 4/2005 |
|---|---|---|
| EP | 1674848 A1 | 6/2006 |
| JP | 2007-265266 A | 10/2007 |
| JP | 2009-259043 A | 11/2009 |

OTHER PUBLICATIONS

Clark et al., Tire Modeling and Contact Problems: Heat Generation in Aircraft Tires, Computers & Structures, vol. 20, 1985.*
"Strain energy", Wikipedia, retrieved Sep. 11, 2014.*
"Tire manufacturing", Wikipedia, retrieved Sep. 11, 2014.*
Extended European Search Report for European Application No. 12165117.8 dated Aug. 9, 2012.
Muliana et al., "A concurrent micromechanical model for predicting nonlinear viscoelastic responses of composites reinforced with solid spherical particles," International Journal of Solids and Structures, vol. 44, pp. 6891-6913, 2007.

* cited by examiner

*Primary Examiner* — Aniss Chad
(74) *Attorney, Agent, or Firm* — Birch, Stewart, Kolasch & Birch, LLP

(57) ABSTRACT

A computerized simulation method to obtain a loss tangent of a rubber compound comprising a rubber matrix and filler particles, wherein a model of the rubber compound is generated; as deformation conditions thereof, two different values of strain are defined; deformation simulations are made under the two different values of the strain, to compute a normal strain and a shear strain of each element under each of the two different values of the strain, and to compute an energy loss of each element by the use of the computed strain; and the loss tangent of the rubber compound is computed from the sum of the energy losses of all of the elements, a strain amplitude caused by the difference between the two different values of the strain, and an elastic modulus of the rubber compound model.

1 Claim, 10 Drawing Sheets

METHOD FOR SIMULATING RUBBER COMPOUND

BACKGROUND OF THE INVENTION

The present invention relates to a computerized method for simulating a rubber compound comprising a rubber matrix and filler particles which serves to estimate the loss tangent values for a short time.

In general, in order to know properties such as loss tangent values of a rubber compound, the rubber compound is measured for its strain and stress by the use of a viscoelasticity tester, and a loss tangent value is determined from the relationship between the strain and stress. In the measurement, a strain (a) is applied to the rubber compound, wherein the strain (a) has a fixed semi-amplitude and a fixed frequency and the strain (a) varies as shown in FIG. 12, and the stress (b) caused by the strain is measured. To give a more concrete example, a test specimen of a rubber compound is applied by an initial tensile stress of 10%, and the test specimen is further applied by strain which varies sinusoidally with a semi-amplitude of 1% and a frequency of 10 Hz. under such condition, the resultant stress is measured, wherein the stress measured is varied sinusoidally similarly to the strain but there is a phase lag (phase difference δ).

using this phase lag or difference δ and also the semi-amplitude σ0 of the stress (b) and the semi-amplitude ϵ0 of the strain (a), the loss tangent can be determined as follows.

Storage elastic modulus $E'=(\sigma 0/\epsilon 0) \cdot \cos \delta$

Loss elastic modulus $E''=(\sigma 0/\epsilon 0) \cdot \sin \delta$

Loss tangent $\delta = E''/E'$

In recent years, on the other hand, in order to design and develop a rubber compound comprising a rubber matrix and filler particles, computerized methods for simulating a rubber compound have been proposed for example as disclosed in Japanese Patent Application Publication Nos. 2006-175937 and 2009-259043.

In such a computer simulation, as the rubber molecular chain and filler can be included in the simulation calculation, it becomes possible to estimate properties of the rubber compound without producing a number of rubber compounds experimentally. Therefore, by utilizing the above-mentioned simulation, it becomes possible to predict how the properties of a rubber compound are changed by employing different compositions with respect to filler contents such as carbon and silica for example, without actually producing various rubber compounds.

In the above-mentioned simulation methods, it is impossible to provide a continuously-varying sinusoidal strain (a) as a deformation condition for the rubber compound model. Therefore, as shown in FIG. 11(a), the strain whose amplitude varies sinusoidally is provided discretely by a fixed time increment Δt, and for each discrete strain, the stress is computed through a convergence calculation technique. As a result, the stress response as shown in FIG. 11(b) as an example is obtained.

On the other hand, in order to obtain the loss tangent value, it is necessary to know the above-mentioned phase lag or difference. In order to obtain the phase difference accurately, a continuously-changing stress curve is necessary in determining the time when the amplitude σ0 occurs. Heretofore, therefore, a sine wave most fitting to the computed discrete stress values is obtained as an approximate waveform of the stress, and the time when the amplitude v0 occurs is determined by the use of the approximate waveform.

In the above-mentioned simulation methods, in order to improve the accuracy of the approximate waveform of the stress, the computation of the stress value has to be made frequently as shown in FIG. 11(b). In other words, the number of the computations per one cycle has to be increased. Further, to obtain a stable computational value of the phase difference between the stress and strain, the computations have to be made over multiple cycles. Thus, the computational time and cost increase.

SUMMARY OF THE INVENTION

It is therefore, an object of the present invention to provide a method for simulating a rubber compound by which the loss tangent can be estimated accurately for a short time.

According to the present invention, a computerized method for simulating a rubber compound comprising a rubber matrix and filler particles to obtain a loss tangent of the rubber compound, comprises:

a step in which a rubber compound model of the rubber compound is generated, wherein the rubber matrix and the filler particles are each split into a finite number of elements, a step in which two different values of strain are defined as deformation conditions of the rubber compound model, a step in which deformation simulations of the rubber compound model are made under the two different values of the strain, to compute a normal strain and a shear strain of each of the elements under each of the two different values of the strain, and to compute an energy loss of each of the elements by the use of the computed strain, and a step in which the loss tangent of the rubber compound is computed from the sum of the energy losses of all of the elements, a strain amplitude caused by the difference between the two different values of the strain, and an elastic modulus of the rubber compound model.

The above-mentioned energy loss of each of the elements may be an energy loss per unit volume computed by the use of the following expression $\Sigma \pi \cdot E \cdot (\epsilon p/2)^2 \cdot \text{Loss tangent } \delta$ wherein Σ is the sum of the normal strain and shear strain of the element, E is a storage elastic modulus of the element, ϵp is the variation of the strain of the element to which the two different values of the strain are respectively applied, and Loss tangent δ is the loss tangent of the element.

The loss tangent of the rubber compound model may be computed by the use of the following expression $Wa/(\pi \cdot Ea \cdot \epsilon a^2)$ wherein Wa is the sum of the energy loss per unit volume of all of the elements, Ea is the elastic modulus of the rubber compound model, and ϵa is a strain amplitude caused by the difference between the two different values of the strain.

Therefore, from the energy loss values in each element under the two different values of the strain, the overall energy loss of the rubber compound model can be obtained. Accordingly, the loss tangent of the rubber compound model can be obtained with less amount of calculation time.

DESCRIPTION OF THE PREFERRED EMBODIMENTS

Embodiments of present invention will now be described in detail in conjunction with accompanying drawings.

The method for simulating a rubber compound according to the present invention is to compute the loss tangent of a rubber compound comprising a rubber matrix and filler particles by utilizing a computer system.

Figure 1:
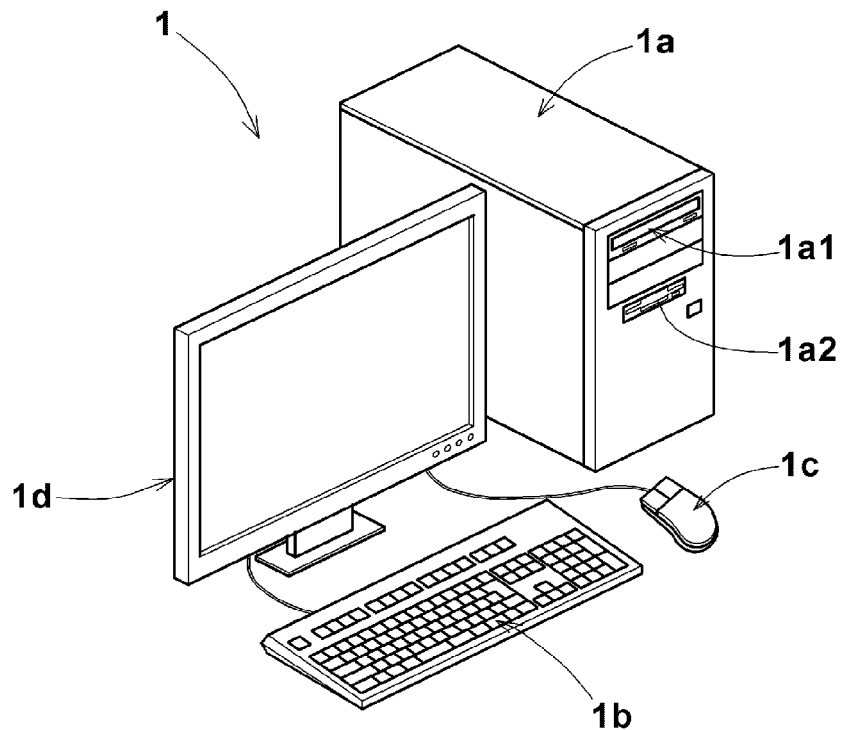
FIG. 1 is a perspective view showing a computer system implementing a simulation method according to an embodiment of the present invention.

FIG. 1 shows a computer system 1 implementing the simulation method.

The computer system 1 comprises a computer 1a, a keyboard 1b, a mouse 1c and a display 1d. In the computer 1a, included are a central processing unit (CPU), a read-only memory (ROM), work memory and mass-storage device such as magnetic disk. Further, the computer 1a is provided with an optical disk drive unit 1a1 and a flexible disk drive unit 1a2. In the mass-storage device, the after-mentioned procedure (program) of the simulation method is stored.

In this embodiment, the rubber compound is for use in a tire. In the rubber compound, the filler particles, e.g. carbon particles, silica particles and the like are dispersed in the rubber matrix. Usually, such a rubber compound has a loss tangent of about 0.1 to 0.4 under such a measuring condition that the temperature is 30 degrees C., the frequency is 10 Hz, the semi-amplitude of the strain is 1%, and the initial strain is 10%.

Figure 2:
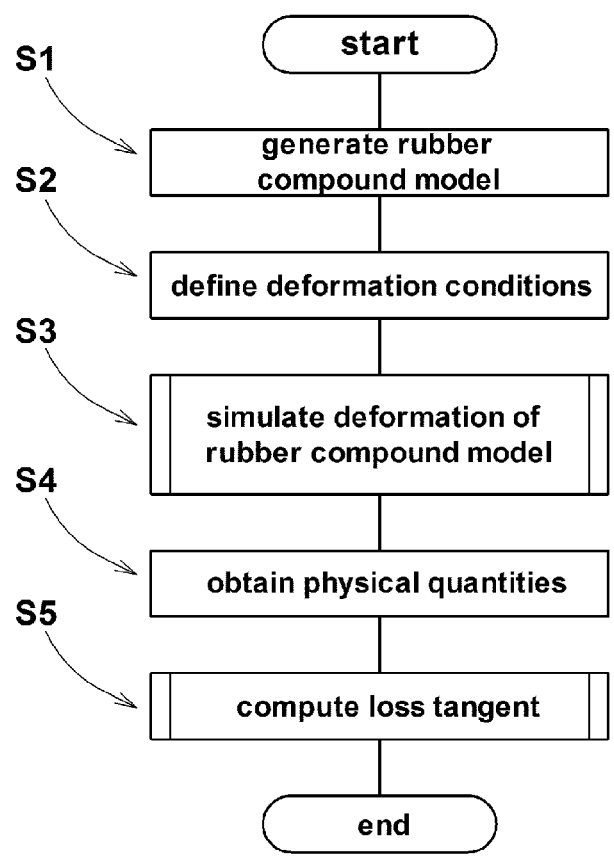
FIG. 2 is a flow chart of a procedure for the simulation method according to the embodiment of the present invention.

In FIG. 2, an example of the procedure of the simulation method is shown.

Step S1

In this example, firstly, a model of the rubber compound (hereinafter "rubber compound model") is defined. (step S1)

Figure 3A:
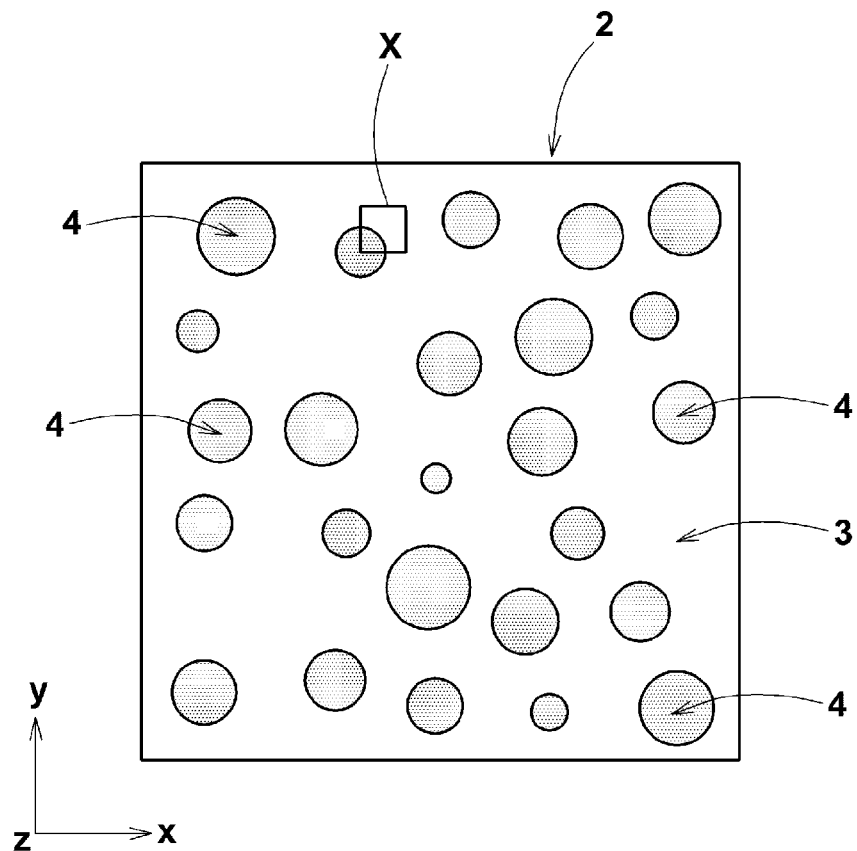
FIG. 3(a) is a diagram showing an example of a rubber compound model (of a microscopic structure of rubber compound).

FIG. 3(a) shows a type of the rubber compound model 2. This model 2 is of a microscopic structure (or a very small part) of the rubber compound. Thus, this model 2 is used as a minimum unit repeated to constitute the entirety of the rubber compound model.

In the case of a two-dimensional model, the rubber compound model 2 is a quadrate of 300 nm×300 nm for example.

The rubber compound model 2 is formed by splitting the microscopic structure into a finite number of elements 2a, 2b, 2c - - - .

The elements 2a, 2b, 2c - - - are defined so that a numerical analytical approach is possible, specifically, a deformation calculation on each element and the entire system is possible by a numerical analysis method, for example, a finite element method, finite volume method, difference method, boundary element method or the like.

For that purpose, coordinate values of the node point in the coordinate system, a configuration of the element, a material characteristic of the element representing the actual material, and the like are defined in each of the elements 2a, 2b, 2c - - - .

As to the configuration of each element, a triangular or quadrilateral element (when two-dimensional) or a tetrahedral or hexahedral element (when three-dimensional) can be used preferably.

In the after-mentioned deformation simulation in this embodiment, in order to analyze the plane strain of the rubber compound, a simulation of a tensile deformation in the Y-axis direction of the rubber compound model 2 is carried out. In this embodiment, therefore, a two-dimensional simulation where there is no strain in the z-axis direction is carried out.

Regardless of the microscopic structure or the entirety, the rubber compound model 2 is made up of a model 3 of the rubber matrix (hereinafter the "rubber matrix model"), models 4 of the filler particles dispersed in the rubber matrix model 3 (hereinafter, the filler models"), and interface models 5 each surrounding one of the filler models 4 to be positioned between the filler model and the rubber matrix model.

The rubber matrix model 3 occupies a major part of the rubber compound model 2, and is made up of a plurality of triangular elements and a plurality of quadrilateral elements in this 2-D model.

In order to make deformation calculation, on each element of the rubber matrix model 3, a function expressing the relationship between the stress and elongation is defined as its physical property.

In the simulation method in this embodiment, in order to express the rubber elastic response, the computation is made on each of the rubber matrix model 3 and a rubber domain of each of the interface models 5, based on a molecular chain network theory disclosed in Japanese Patent Application Publication Nos. 2010-205165 and 2009-216612. The disclosed method is incorporated in this simulation method as it is disclosed, therefore, a detailed explanation is omitted here.

The filler model 4 in this embodiment models a particle of silica and is made up of a plurality of quadrilateral elements so as to have a substantial circular form in the case of a two-dimension model. In the case of a three-dimension model, the filler model 4 is formed to have a substantially spherical form. In any case, the diameter of the silica particle is about 10 to 300 nm.

The silica particle is very hard when compared with the rubber matrix. Therefore, the filler model 4 is treated as an elastic body rather than a viscoelastic body, and physical properties substantially same as those of the silica (as an analysis object) are defined on the filler model 4.

The number of the particles or filler models per unit volume is determined according to the filler content of the rubber compound to be simulated.

The above-mentioned interface model 5 is introduced in order to simulate the function of a silane coupling agent. As well known in the art, the silane coupling agent has a function to chemically-couple the silica filler and the rubber matrix together.

In this embodiment (when 2-D), the interface model 5 is annular and continuously extends around the filler model 4 with a small thickness t. The inner periphery of the interface model 5 abuts on and is bound to the outer periphery of the filler model 4.

The condition defined between the inner periphery of the interface model 5 and the outer periphery of the filler model 4 is such that they are not separated from each other. However, if desired, it is also possible to define such a condition that the filler model 4 and the interface model 5 are separated from each other at their boundary when a stress more than a predetermined value is occurred therebetween.

The outer periphery of the interface model 5 abuts on and is bound to the rubber matrix model 3.

It is a preferable that the thickness t of the interface model 5 is defined as being in a range of about 10 to 30%, more preferably about 15 to 25% of a maximal diameter of the filler model 4 because it was discovered through experiments that simulation results well coincide with actual rubber compounds.

On the interface model 5, a relationship between the stress and elongation is defined. Further, based on the physical properties of the actual silica as the interfacial coupler, there are defined on the interface model 5 such physical properties that it is softer than the filler model 4 and harder than the rubber matrix and is hard to elongate than the rubber matrix.

On the rubber matrix model 3, filler model 4 and interface model 5, the physical properties, for example, densities, elastic moduli, loss tangent values and the like of the rubber matrix, the filler and the interfacial part are defined based on the data already known from experimental results and the like.

Step S2

Next, a deformation condition to deform the rubber compound model 2 is defined. (step S2)

Figure 4:
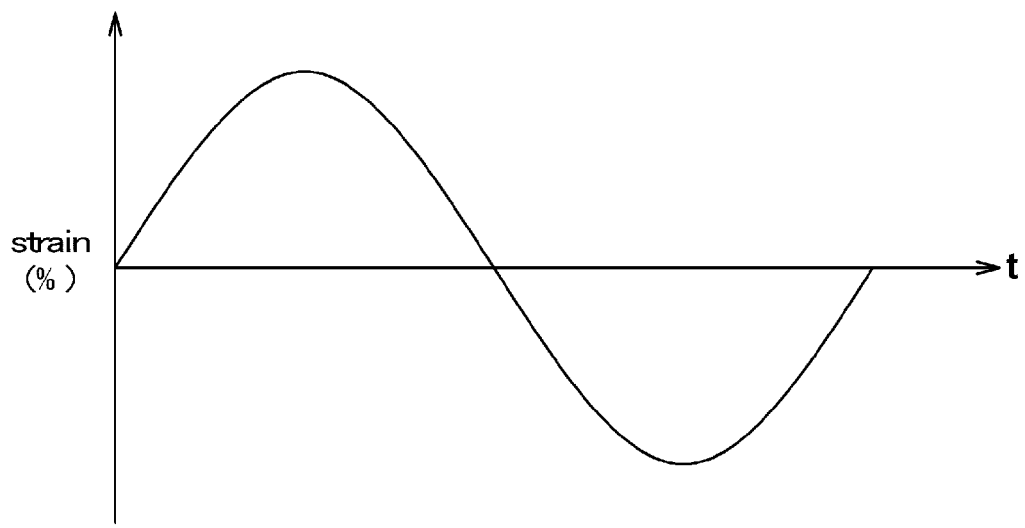
FIG. 4 is a graph for explaining a cyclic strain.

Heretofore, when a rubber compound is measured for a loss tangent delta, a cyclic strain as shown in FIG. 4 is applied to the rubber compound.

Figure 11A:
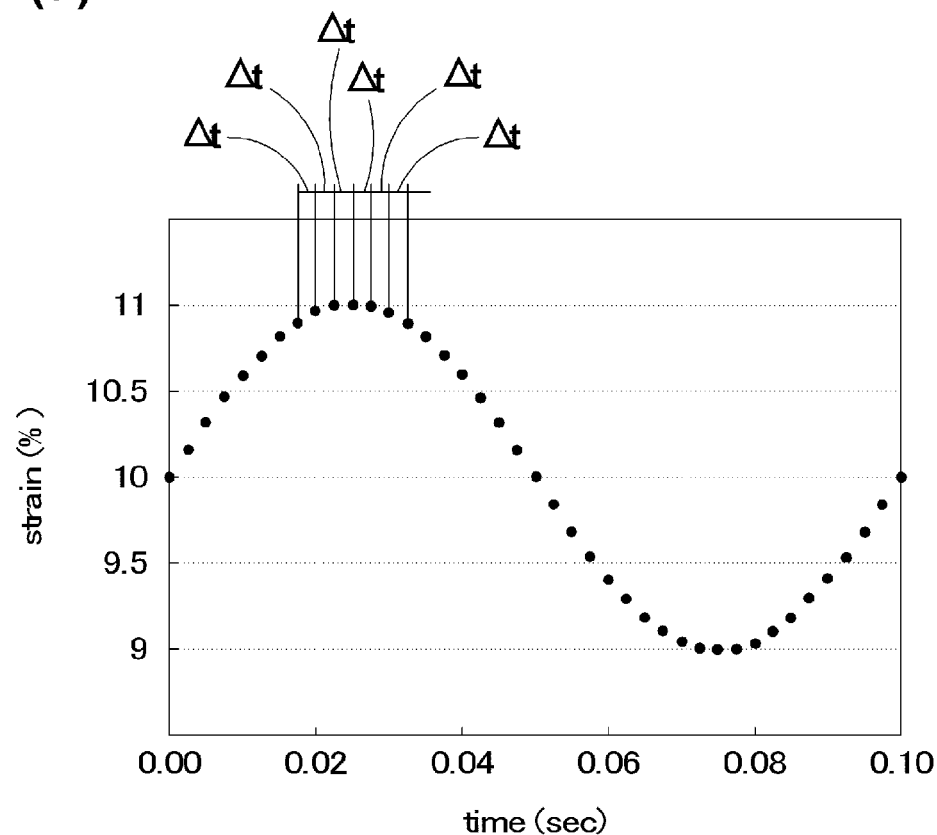
FIG. 11(a) is a graph for explaining discrete strain values used in a conventional simulation method.
Figure 11B:
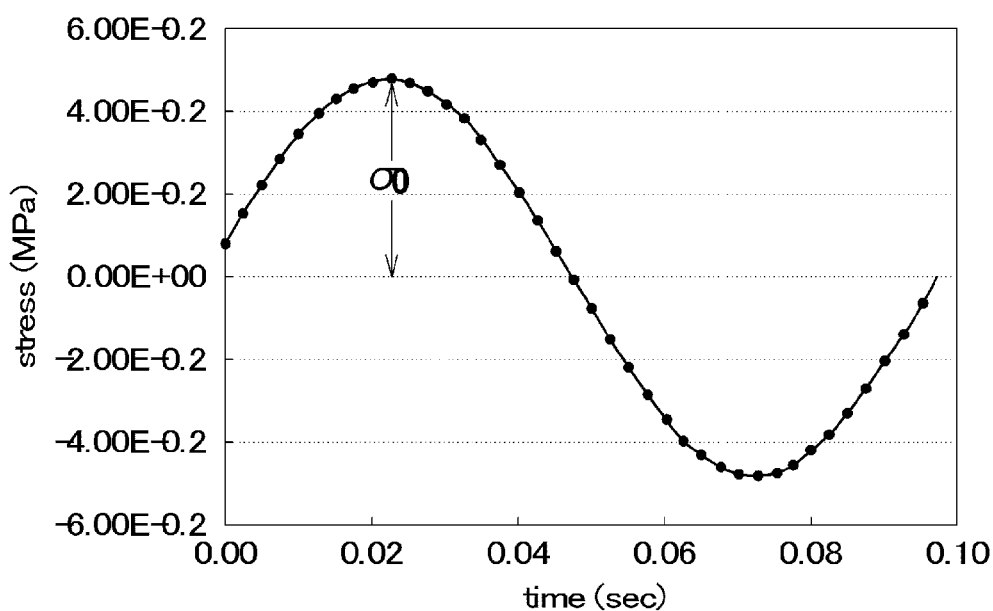
FIG. 11(b) is a graph showing stress values computed from the discrete strain values, respectively.
Figure 12:
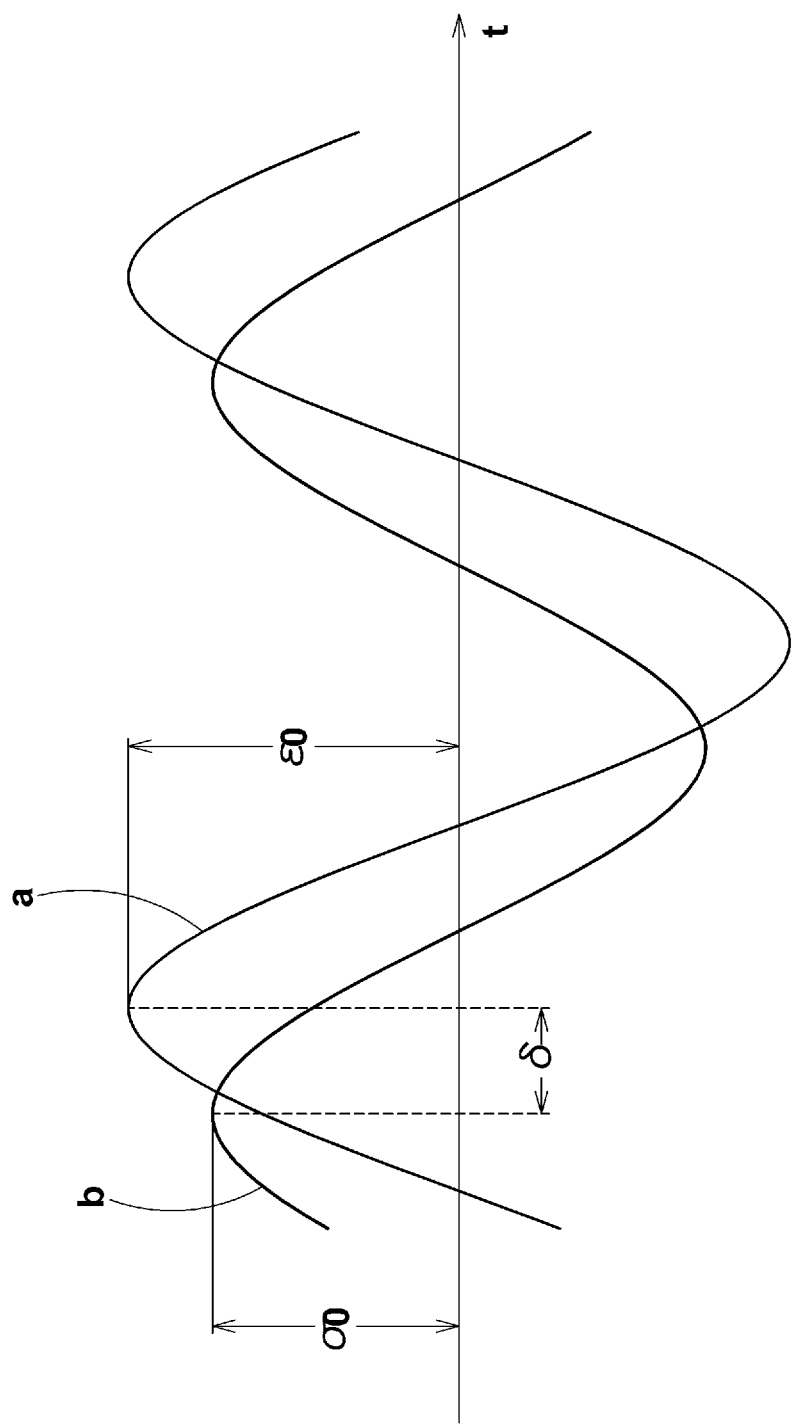
FIG. 12 is a graph for explaining a sinusoidal strain applied to an actual rubber compound and a resultant stress measured.

Heretofore, when computing the loss tangent delta of a rubber compound through a computer simulation, discrete values of a cyclic strain as shown in FIG. 11(*a*) are given to the rubber compound model.

However, according to the present invention, two different values of the strain are defined as the deformation condition for the rubber compound model to obtain the loss tangent from the rubber compound model 2.

The two different values can be determined according to the measuring condition to be simulated.

Figure 5:
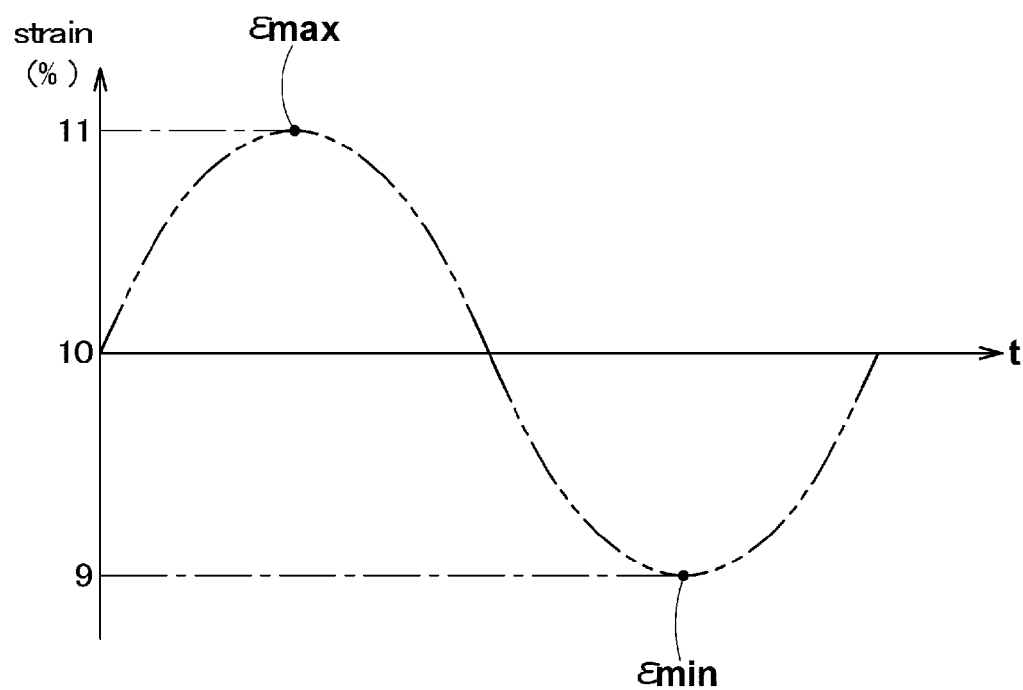
FIG. 5 is a graph showing a strain applied in this embodiment.

For example, when the measuring condition is such that the initial strain is 10% and
the amplitude of the sinusoidal strain is +/−1% as shown in
FIG. 5 by alternate long and two short dashes line, it is not essential but desirable that values of a maximal strain ($\epsilon$max=10+1=11%) and a minimal strain ($\epsilon$min=10−1=9%) are used as the above-mentioned two different values.

Thereby, it becomes possible to make the simulation on the basis of the deformation condition more close to the actual measuring condition.

Step S3

Next, a deformation simulation is carried out by the use of the rubber compound model 2 defined as above. (step S3)

Figure 6:
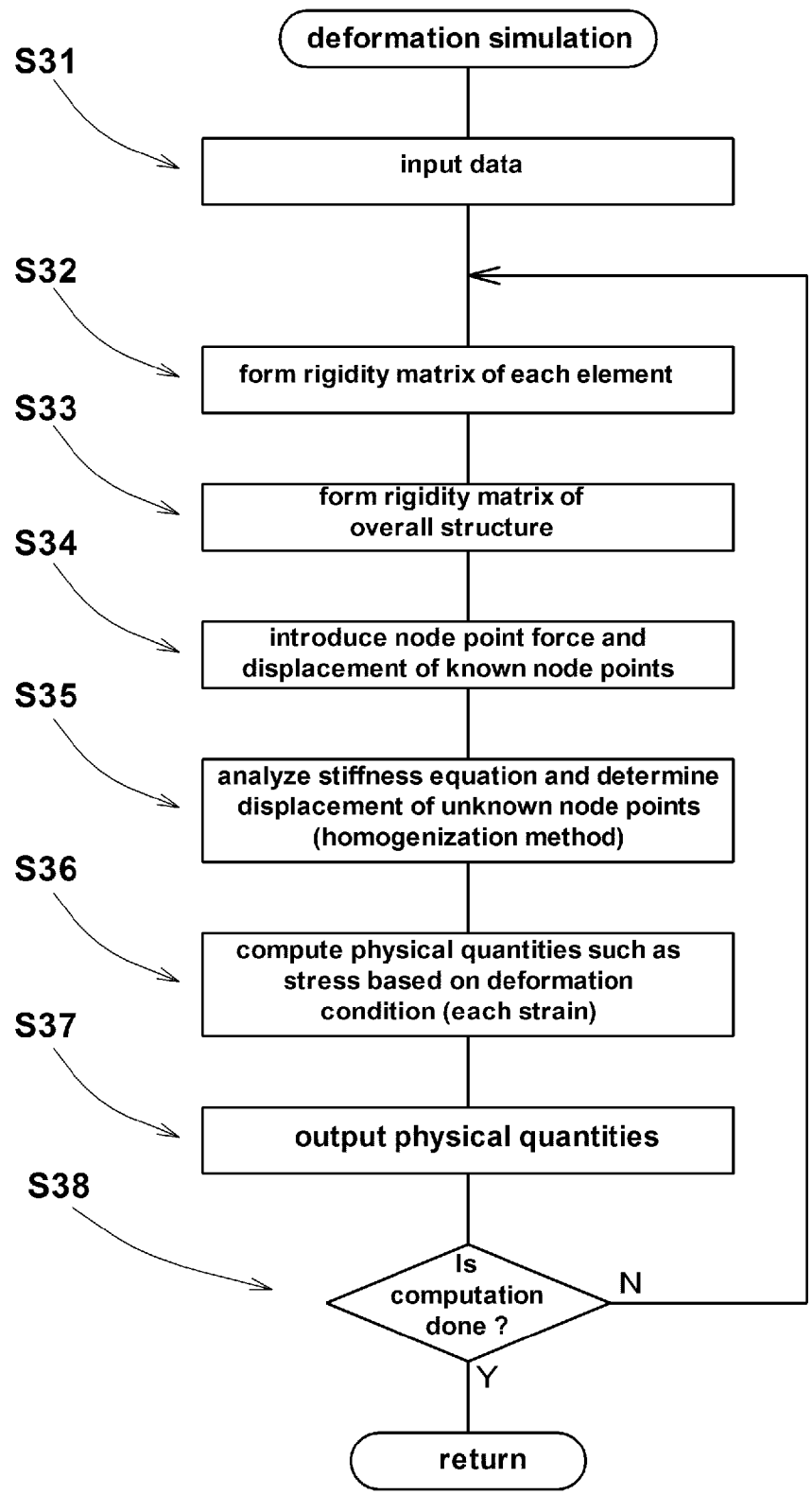
FIG. 6 is a flow chart showing a deformation simulation.

FIG. 6 shows an example of the procedure for the deformation simulation carried out by the computer system 1.

In the deformation simulation, various data on the rubber compound model 2 are input in the computer system 1. (step S31)

The input data include information about the positions of node points defined on the elements and the material properties.

Based on the input data, the computer system 1 forms a rigidity matrix of each element (step S32) and then forms a rigidity matrix of the overall structure (step S33).

In the rigidity matrix of the overall structure, node point force and displacement of known node points are introduced. (step S34) And analysis of stiffness equation is made. Then, unknown node point displacement is determined. (step S35) And stress based on the predetermined deformation condition (each strain) is computed. (step S36) At this time, the computer system 1 makes the computation by giving one of the above-mentioned two different values of the strain to the rubber compound model 2 as a deformation condition.

Then, the computer system 1 outputs the results toward the storage device and the like. (step 37)

In step S38, it is determined whether the computation should be done or not.

If the computation has already been done on each of the two different values of the strain, then the process returns to step S4 in FIG. 1.

If the computation has not been done on all of the two different values of the strain, then the steps S32-S37 are repeated under a new condition of the strain.

Such simulation or deformation calculation can be made by the use of, for example, an engineering analysis applications software employing a finite element method (such as "LS-DYNA", a general-purpose simulation software package developed by the Livermore Software Technology Corporation).

In this embodiment, the simulation is made according to a homogenization method (asymptotic expansion homogenization method).

Figure 3B:
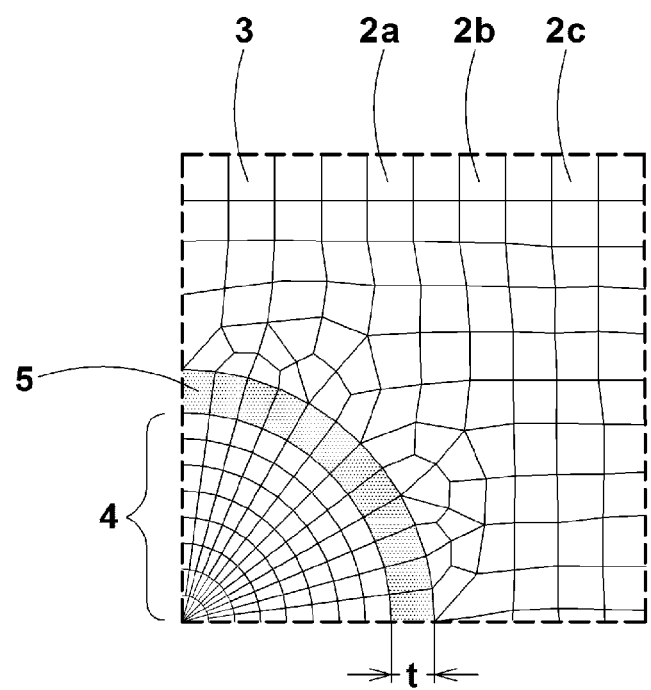
FIG. 3(b) is an enlargement of part x in FIG. 3(a).
Figure 7:
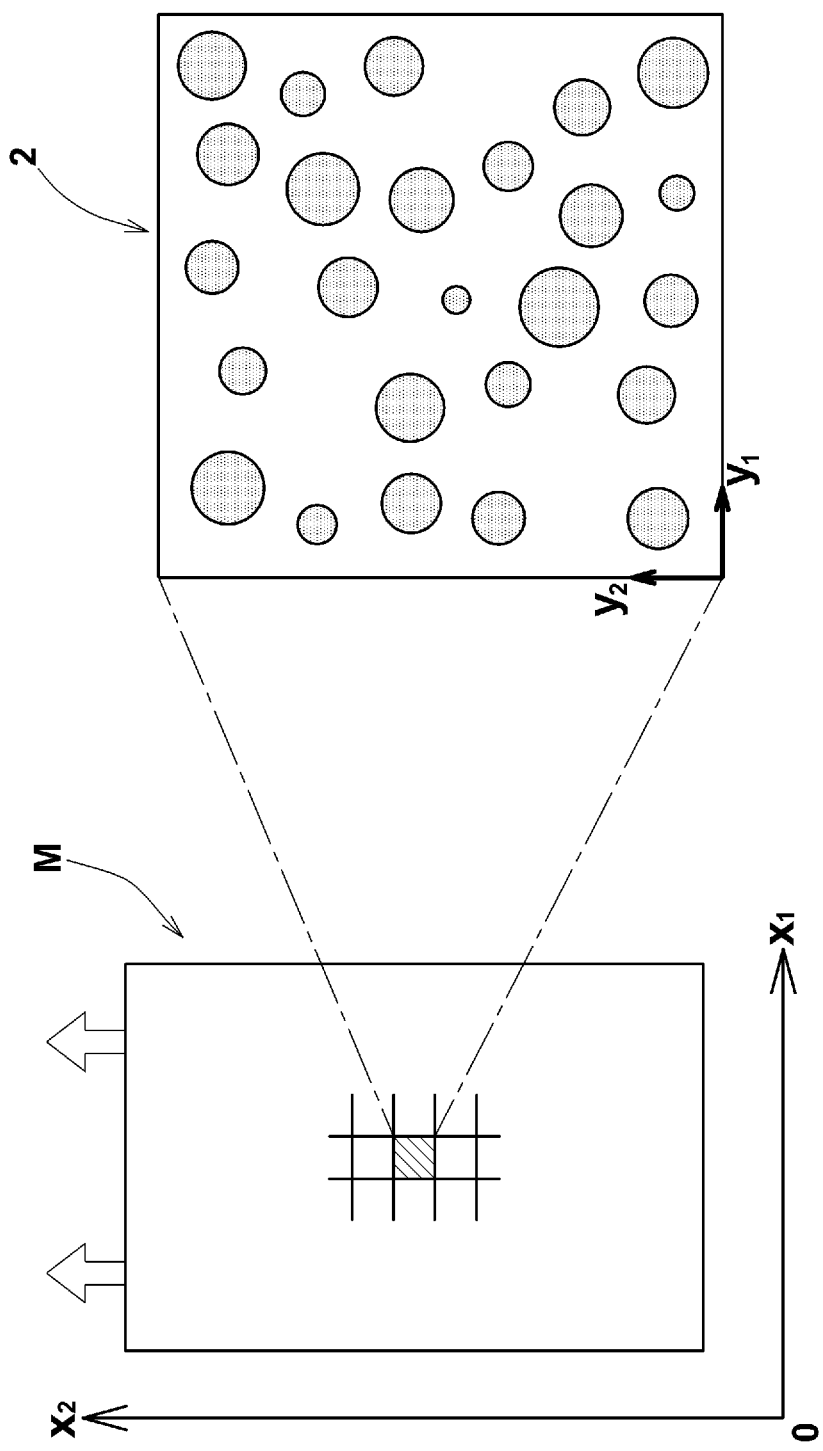
FIG. 7 is a schematic diagram for explaining a homogenization method.

AS shown in FIG. 7, the homogenization method is based on hypothesis that the entirety M of the rubber compound is formed by a microscopic structure as shown in FIG. 3 (called "unit cell" according to the homogenization method) arranged periodically. And two independent variables "xI" expressing the entirety M of the rubber compound and "yI" expressing the microscopic structure are used.

By the asymptotic expansions of the independent variable yI in the microscopic scale and the independent variable xI in the macroscopic scale, the average mechanical response of the entirety of the rubber compound can be obtained approximately on the basis of the microscopic structure.

Step S4

From the results of the deformation calculation, the computer system 1 takes out (on the memory or the like) necessary physical quantities. (step S4)

The physical quantities include the normal strain and shear strain of each element under each of the two different values of the strain.

Figure 8A:
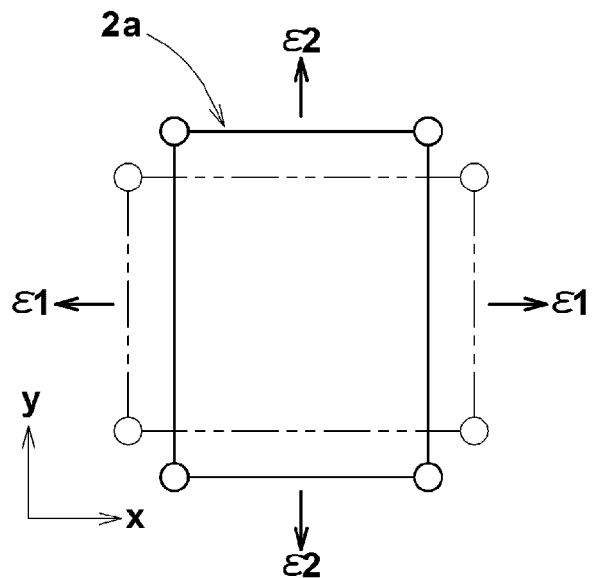
FIGS. 8(a), 8(b) and 8(c) are diagrams for explaining normal strain and shear strain of an element.
Figure 8B:
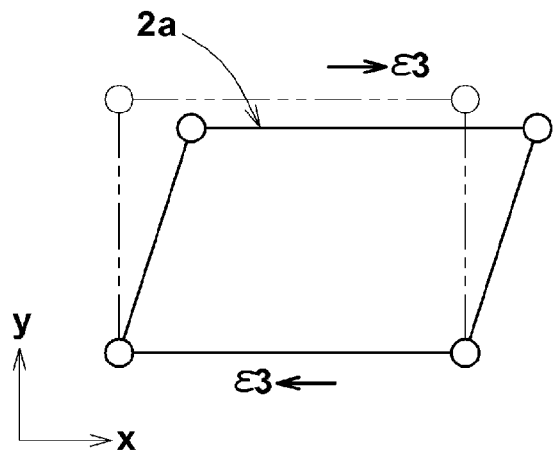
Figure 8C:
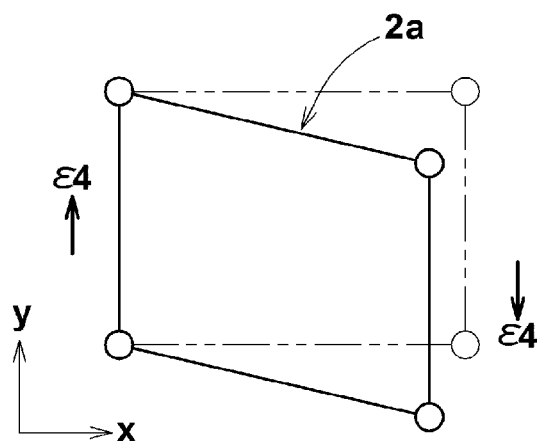

In the case of a two-dimensional solid element 2*a*, as shown in FIG. 8(*a*), a normal strain includes a normal strain $\epsilon$1 in the x-axis direction and a normal strain $\epsilon$2 in the Y-axis direction, and
a shear strain includes a shear strain $\epsilon$3 in the x-axis direction as shown in FIG. 8(*b*) and a shear strain $\epsilon$4 in the Y-axis direction as shown in FIG. 8(*c*).

In the case of a three dimensional element, a normal strain further includes a normal strain in the z-axis direction in addition to those in the x-axis and Y-axis directions, and a shear strain further includes a shear strain in the z-axis direction in addition to those in the x-axis and Y-axis directions.

Step S5

Next, the loss tangent of the rubber compound model 2 is computed. (step S5)

Figure 9:
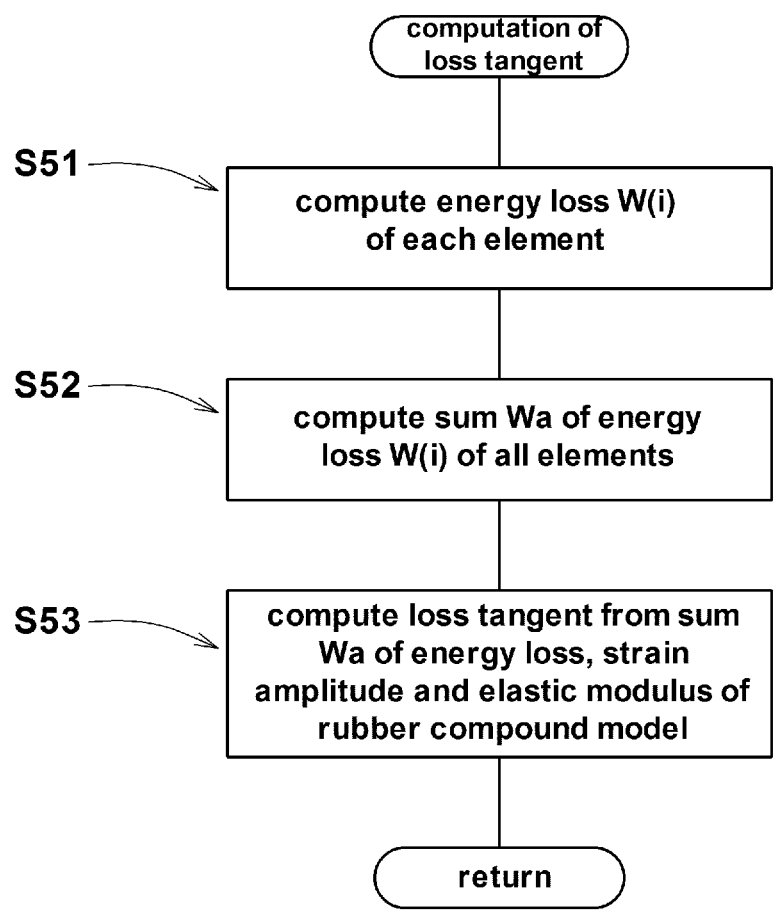
FIG. 9 is a flow chart of a procedure for computing the loss tangent.

FIG. 9 shows an example of computation of the loss tangent. In this example, for each of the elements 2a, 2b, 2c - - -, the computer system 1 calculates an energy loss W(i) per unit volume (i: 1 to the number of elements) by the use of the following expression (1). (step S51)

$$W(i) = \Sigma \pi \cdot E \cdot (\epsilon p/2)^2 \cdot \text{Loss tangent } \delta(i) \qquad \text{Expression (1)}$$

wherein $\Sigma$ is the sum of the normal strain and shear strain of the element, E is the storage elastic modulus of the element, $\epsilon p$ is the variation of the strain of the element to which the two different values of the strain ($\epsilon$max, $\epsilon$min) are respectively applied, and Loss tangent $\delta(i)$ is the loss tangent of the element.

Incidentally, the expression (1) is a known theoretical formula obtained experimentally.

Next, the computer system 1 calculates the sum Wa of the energy loss W(i) of all of the elements. (step S52)

Then, the computer system 1 calculates the loss tangent of the rubber compound model 2 by the use of the following expression (2) obtained by applying the expression (1) to the entirety of the rubber compound model. (step S53)

$$\text{loss tangent} = Wa/(\pi \cdot Ea \cdot \epsilon a^2) \qquad \text{Expression (2)}$$

wherein

Wa is the sum of the energy loss W(i) per unit volume of all of the elements,

Ea is the elastic modulus of the rubber compound model, $\epsilon a$ is the strain amplitude $\{(\epsilon\text{max}-\epsilon\text{min})/2\}$ caused by the difference between the two different values of the strain.

The elastic modulus Ea of the rubber compound model can be obtained by the use of the following expression based on the relationship between the stress $\sigma$ and strain $\epsilon$.

$$Ea = (\sigma\text{max} - \sigma\text{min})/(\epsilon\text{max} - \epsilon\text{min})$$

wherein

"$\sigma$" means the average stress obtained from the stress of all of the elements and the volume of the element, and "$\sigma$max−$\sigma$min" means the difference between the maximum and minimum thereof.

As explained above, according to the present invention, from the energy loss of each element under the two different values of the strain, the energy loss of the entirety of the rubber compound model is computed, and from this the loss tangent delta is computed.

Figure 10:
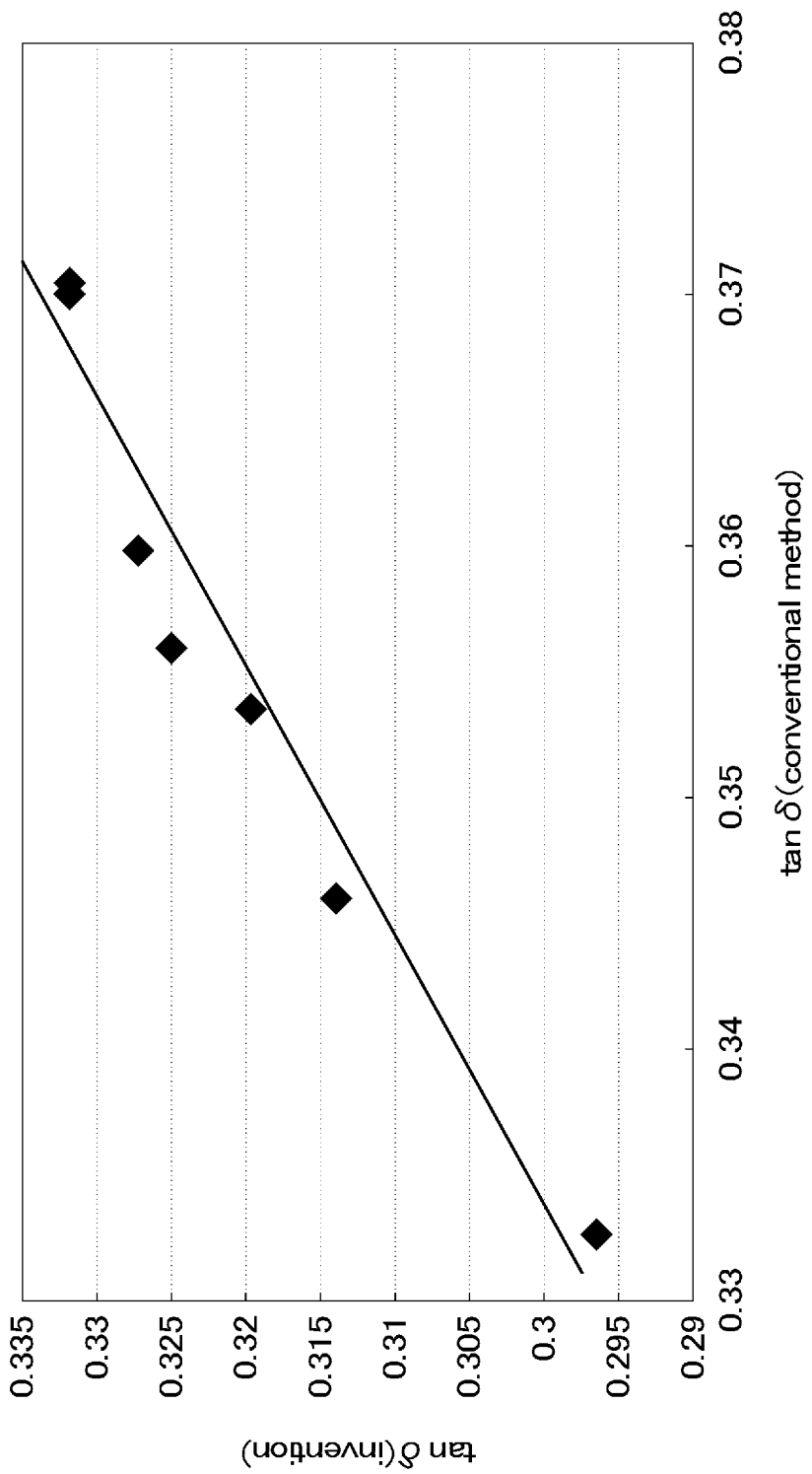
FIG. 10 is a graph showing an comparison between simulation results of the present invention and conventional method.

Therefore, the loss tangent of the rubber compound model can be obtained by a less computational cost FIG. 10 is a graph showing the loss tangent obtained through the simulation method according to the present invention by the use of the rubber compound model 2 shown in FIG. 3 and the loss tangent obtained through a conventional method.

The simulation conditions are as follows:

Initial elongation of rubber compound: 10% semi-amplitude of sinusoidal strain: 1% frequency: 10 Hz

In the conventional method, as the deformation condition for the rubber compound model, as shown in FIG. 11(a), a strain varying at a short time increment $\Delta t1$ was given discretely several times. In the conventional method, the stress was iteratively calculated until the phase lag from the strain is stabilized. In this particular case, seven cycles were necessitated to stabilize.

In the present invention method, on the other hand, as the deformation condition of the rubber compound model as shown in FIG. 5, only two different values ($\epsilon$max=11% and $\epsilon$min=9%) at a maximal peak and a minimal peak of the amplitude of the strain were given.

As apparent from FIG. 10, the present invention method and the conventional method have a positive correlation with respect to the loss tangent delta.

And the time required for computing the loss tangent in the case of the present invention was decreased down to about 1/15 times that of the conventional method.

Thus, according to the present invention, the loss tangent of the rubber compound can be estimated accurately at short times.

The invention claimed is:

1. A computerized method for simulating a rubber compound comprising a rubber matrix and filler particles to obtain a loss tangent of the rubber compound, comprising:

generating a rubber compound model of the rubber compound, wherein the rubber matrix and the filler particles are each split into a finite number of elements;

defining two different values of strain as deformation conditions of the rubber compound model;

performing deformation simulations of the rubber compound model under said two different values of the strain, to compute a nail strain and a shear strain of each of the elements under each of said two different values of the strain, and to compute an energy loss of each of the elements by the use of the computed normal strain and the computed shear strain, wherein said energy loss of each of the elements is an energy loss W per unit volume computed by the use of the following expression $$W = S \cdot \pi \cdot E \cdot (\epsilon p/2)^2 \cdot \delta$$

where

S is the sum of said computed normal strain and said computed shear strain of the element concerned, E is a storage elastic modulus of the element concerned, $\epsilon p$ is a variation of the strain of the element concerned to which said two different values of the strain are respectively applied, and $\delta$ is a loss tangent of the element concerned; and computing the loss tangent of the rubber compound by the use of the following expression $$\text{Loss tangent} = Wa/(\pi \cdot Ea \cdot \epsilon a^2)$$

where

Wa is the sum of the energy losses W per unit volume of all of the elements,

Ea is an elastic modulus of the rubber compound model, and $\epsilon a$ is a strain amplitude caused by a difference between said two different values of the strain.

\* \* \* \* \*